United States Patent
Lv

(10) Patent No.: US 10,564,461 B2
(45) Date of Patent: Feb. 18, 2020

(54) METHOD OF FORMING CRYSTALLINE ITO THIN FILM AND METHOD OF FORMING ON-CELL TYPE TOUCH PANEL

(71) Applicant: WUHAN CHINA STAR OPTOELECTRONICS TECHNOLOGY CO., LTD, Wuhan, Hubei (CN)

(72) Inventor: Shaoqing Lv, Hubei (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 5 days.

(21) Appl. No.: 15/576,024

(22) PCT Filed: Oct. 12, 2017

(86) PCT No.: PCT/CN2017/105812
§ 371 (c)(1),
(2) Date: Nov. 21, 2017

(87) PCT Pub. No.: WO2019/051913
PCT Pub. Date: Mar. 21, 2019

(65) Prior Publication Data
US 2019/0086704 A1    Mar. 21, 2019

(30) Foreign Application Priority Data
Sep. 18, 2017 (CN) .......................... 2017 1 0842690

(51) Int. Cl.
*G02F 1/1333*    (2006.01)
*C23C 14/35*    (2006.01)
(Continued)

(52) U.S. Cl.
CPC ........ *G02F 1/13338* (2013.01); *C23C 14/086* (2013.01); *C23C 14/35* (2013.01);
(Continued)

(58) Field of Classification Search
CPC ......... C23C 14/08; C23C 14/34; C23C 14/58; C23C 14/35; C23C 14/086;
(Continued)

(56) References Cited

U.S. PATENT DOCUMENTS

| 2002/0016075 A1 | 2/2002 | Peng et al. | |
| 2003/0184688 A1* | 10/2003 | Kim | G02F 1/13439 349/43 |
| 2006/0046460 A1* | 3/2006 | Shu | H01L 21/28512 438/608 |

FOREIGN PATENT DOCUMENTS

| CN | 1866092 A | 11/2006 |
| CN | 101645336 A | 2/2010 |
| CN | 105103093 A | 11/2015 |

OTHER PUBLICATIONS

Chung et al. "Crystallization of Ultra-Low Temperature ITO by XeCl Excimer Laser Annealing" Dept. of Materials Science and Engineering, Cornell University, Ithaca NY USA (Year: 2002).*

* cited by examiner

*Primary Examiner* — Roy K Potter
(74) *Attorney, Agent, or Firm* — Mintz Levin Cohn Ferris Glovsky and Popeo, P.C.; Steven M. Jensen

(57) ABSTRACT

The present disclosure provides a method of forming a crystalline ITO thin film for forming the crystalline ITO thin film on a liquid crystal panel and a method of forming an On-cell type touch panel by using the method of forming a crystalline ITO thin film. The method of forming a crystalline ITO thin film includes: forming a noncrystalline ITO thin film on a surface of a side of a color filter substrate being far away from the liquid crystal layer, by a deposition process; and crystallizing the noncrystalline ITO thin film by an excimer laser anneal process at a preset temperature so as to obtain the crystalline ITO thin film.

16 Claims, 4 Drawing Sheets

(51) Int. Cl.
    *C23C 14/08*     (2006.01)
    *C23C 14/58*     (2006.01)
    *G06F 3/041*     (2006.01)
    *G06F 3/044*     (2006.01)

(52) U.S. Cl.
    CPC .......... *C23C 14/5813* (2013.01); *G06F 3/041* (2013.01); *G02F 2201/50* (2013.01); *G02F 2202/16* (2013.01); *G06F 3/044* (2013.01); *G06F 2203/04103* (2013.01)

(58) Field of Classification Search
    CPC . C23C 14/5813; H01L 33/42; H01L 27/1222; H01L 51/5203; H01L 31/1884; H01L 2251/308; H01L 51/442; G02F 1/13338; G02F 2202/16; G06F 3/044; G06F 2203/04103
    See application file for complete search history.

METHOD OF FORMING CRYSTALLINE ITO THIN FILM AND METHOD OF FORMING ON-CELL TYPE TOUCH PANEL

CROSS-REFERENCES TO RELATED APPLICATIONS

This application is a U.S. national phase application, pursuant to 35 U.S.C. § 371, of PCT/CN2017/105812, filed Oct. 12, 2017, designating the United States, which claims priority to Chinese Application No. 201710842690.9, filed Sep. 18, 2017. The entire contents of the aforementioned patent applications are incorporated herein by this reference.

TECHNICAL FIELD

The present disclosure relates to a process of manufacturing a touch display device, especially to a method of forming a crystalline ITO thin film and further to a method of forming an On-cell type touch panel.

BACKGROUND ART

With development of information era and acceleration of rhythm of life, a touch technology has gradually replaced traditional mouse and keyboard for the characteristics thereof, such as humanized designs, simple and rapid input, and the like, and has been widely applied to various electronic products, wherein a capacitive touch screen has been widely used for its advantages, such as a rapid reaction speed, high sensitivity, good reliability, high durability and the like.

According to different modes of setting a touch sensing layer in a display panel, a touch display panel is classified into structures, such as Add on Mode, In-cell and On-cell, etc. An Add on Mode touch display panel cannot satisfy ultra-thin requirements for some hand-held devices and portable devices because of a touch screen and a display panel being disposed independently of each other and the thickness of the product being relatively large. An In-cell touch display panel is disposed by integrating a touch sensing layer into an inner side of a color filter (CF) substrate of a display panel, but the production yield of the In-cell touch display panel is comparatively low due to the comparatively complicated structure and preparation process. An On-cell touch display panel is disposed by setting a touch sensing electrode on an outer side of a color filter substrate of a display panel, and is also one of current main stream touch structures. Generally, the On-cell touch sensing electrode is embed-disposed between a color filter substrate and an upper polarizer.

At present, during the preparing process of the On-cell touch display panel, a liquid crystal panel is first generally formed and includes an array substrate and a color filter substrate which are disposed to face each other, a liquid crystal layer being disposed between the array substrate and the color filter substrate; then a layer of ITO thin film is deposited on the color filter substrate of the liquid crystal panel and is etched to form a patterned touch sensing electrode. The crystalline ITO thin film has characteristics of lower impedance and higher transmissivity than the noncrystalline ITO thin film, thus, the ITO thin film for forming a touch sensing electrode is preferably a crystalline ITO thin film.

The existing method of forming a crystalline ITO thin film is mainly a high temperature annealing crystallization method: 1. depositing a noncrystalline ITO thin film using a low temperature sputtering process; and 2. placing the noncrystalline ITO thin film in an annealing furnace to perform a high temperature annealing crystallization process to obtain a crystalline ITO thin film. However, when forming a crystalline ITO thin film on a liquid crystal panel, since the highest temperature which a liquid crystal layer in a liquid crystal panel may bear is lower than 140° C., while the crystallization temperature of the noncrystalline ITO thin film is generally higher than 200° C., a traditional high temperature annealing crystallization method cannot be applied to forming a crystalline ITO thin film on a liquid crystal panel.

Hence, how to form a crystalline ITO thin film on a liquid crystal panel is a problem which the industry is exploring and solving all the time.

SUMMARY

In light of this, the present disclosure provides a method of forming a crystalline ITO thin film, which may form a crystalline ITO thin film having low impedance and high transmissivity on a liquid crystal panel and may also effectively protect a liquid crystal layer in a liquid crystal panel from being damaged due to high temperature.

In order to achieve the above purpose, the technical solution applied in the present disclosure is as follows:

According to an aspect of the present disclosure, there is provided a method of forming the crystalline ITO thin film for forming a crystalline ITO thin film on a liquid crystal panel, which includes an array substrate and a color filter substrate that are disposed to face each other, a liquid crystal layer being disposed between the array substrate and the color filter substrate, wherein the method includes: forming a noncrystalline ITO thin film on a surface of a side of the color filter substrate being far away from the liquid crystal layer, by a deposition process; and crystallizing the noncrystalline ITO thin film by an excimer laser anneal process at a preset temperature so as to obtain a crystalline ITO thin film.

In the method provided according to an aspect of the present disclosure, wherein the deposition process is a low temperature magnetron sputtering process.

In the method provided according to an aspect of the present disclosure, wherein oxygen gas and argon gas are injected into a reaction chamber as a process gas during the process of forming the noncrystalline ITO thin film by the low temperature magnetron sputtering process.

In the method provided according to an aspect of the present disclosure, wherein a flow rate of the injected oxygen gas is 1 sccm~10 sccm, and a flow rate of the injected argon gas is 150 sccm~250 sccm.

In the method provided according to an aspect of the present disclosure, wherein a thickness of the crystalline ITO thin film is 50~80 nm.

In the method provided according to an aspect of the present disclosure, wherein the preset temperature does not exceed 100° C.

In the method provided according to an aspect of the present disclosure, wherein the preset temperature does not exceed 60° C.

According to another aspect of the present disclosure, there is also provided a method of forming an On-cell type touch panel, which includes forming a touch sensing electrode layer on a liquid crystal panel and adopts the above-mentioned method of forming a crystalline ITO thin film. Particularly, the forming of the touch sensing electrode layer on the liquid crystal panel includes: forming a noncrystalline ITO thin film on a surface of a side of the color filter substrate being far away from the liquid crystal layer, by a deposition process; etching the noncrystalline ITO thin film by a lithographic process so as to form a patterned touch sensing electrode; and crystallizing the noncrystalline ITO thin film corresponding to the patterned touch sensing electrode by an excimer laser anneal process at a preset temperature so as to form a crystalline ITO thin film.

In the method of forming a crystalline ITO thin film provided in the embodiment of the present disclosure, after a noncrystalline ITO thin film is deposited on a liquid crystal panel, an Excimer Laser Anneal (ELA) method is adopted to perform crystallization process on the noncrystalline ITO thin film so as to obtain a crystalline ITO thin film. By using the excimer laser anneal process, an area on a color filter substrate may have a comparatively high temperature to satisfy the requirement for crystallization of the ITO thin film and the crystalline ITO thin film having a low impedance and high transmissivity can be obtained; meanwhile, a temperature of an area in an inner side of the color filter substrate may be controlled to be comparatively low and lower than the highest temperature that the liquid crystal layer may bear, thereby effectively protecting the liquid crystal layer in the liquid crystal panel from being damaged due to high temperature.

DETAILED DESCRIPTION OF EXEMPLARY EMBODIMENTS

Figure 1:
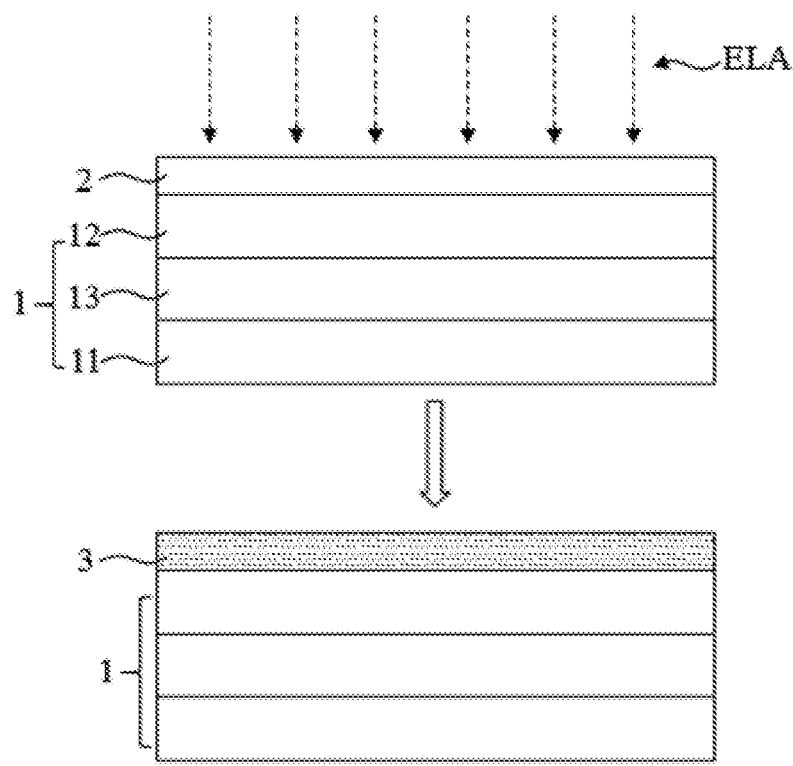
FIG. 1 is an illustrative diagram of a method of forming a crystalline ITO thin film provided in embodiment 1 of the present disclosure.

In order for the purpose, technical solution and advantages of the present disclosure to be clearer, the detailed embodiments of the present disclosure will be further explained below in conjunction with the drawings. The preferred embodiments are exemplified in the drawings. The embodiments of the present disclosure as shown in the drawings and as described according to the drawings are only exemplified, and the present disclosure is not limited to these embodiments.

Here, it is also worthy explaining that, in order to prevent the present disclosure from being obscured due to unnecessary details, the drawings only illustrate the structure and/or processing steps closely related to the solution based on the present disclosure, while other details less related to the present disclosure are omitted.

Embodiment 1

The present embodiment provides a method of forming a crystalline ITO thin film for forming the crystalline ITO thin film on a liquid crystal panel. As shown in FIG. 1, the liquid crystal panel 1 includes an array substrate 11 and a color filter substrate 12 which are disposed to face each other, and a liquid crystal layer 13 is disposed between the array substrate 11 and the color filter substrate 12. The array substrate 11 is a thin film transistor array substrate which includes a glass substrate and thin film transistors disposed in an array on the glass substrate; and the color filter substrate 12 includes a glass substrate and color filter units disposed in an array on the glass substrate. In the present embodiment, the crystalline ITO thin film having low impedance and high transmissivity is formed on the color filter substrate 12, meanwhile, how to protect the liquid crystal layer 13 in the liquid crystal panel 1 from being damaged due to high temperature also needs to be considered.

Particularly, by referring to FIG. 1, the method of forming a crystalline ITO thin film includes:

At S11, a noncrystalline ITO thin film 2 is formed on a surface of a side of the color filter substrate 12 being far away from the liquid crystal layer 13, by a deposition process. Preferably, the deposition process is a low temperature magnetron sputtering process, at this point, the low temperature indicates the highest temperature that a liquid crystal layer may bear, since it is a low temperature deposition that is adopted, a noncrystalline ITO thin film is formed. A Direct Current (DC) sputtering pattern is generally adopted in a magnetron sputtering process. After the liquid crystal panel 1 is transmitted to a chamber of a magnetron sputtering equipment, the chamber is vacuumized and then injected with a process gas, a sputtering is ignited by applying a DC power on a target, and an ITO thin film is directly deposited to a required thickness. As for the thickness of the noncrystalline ITO thin film that needs to be deposited, a crystalline ITO thin film to be formed is mainly considered, and the thickness of the noncrystalline ITO thin film is approximately the same during the process of being crystallized into the crystalline ITO thin film. In the present embodiment, a thickness of the crystalline ITO thin film to be formed is selected to be 50~80 nm.

In the above step, a gas needs to be injected into a reaction chamber to accomplish deposition of the noncrystalline ITO thin film. Generally, the process gas is argon gas which has a stable chemical property and is not easy to react with other substance. In addition, since the ITO material contains oxygen element, the property of oxygen atoms is relatively active and not easily deposited, oxygen gas needs to be supplemented to increase concentration of oxygen atoms during the deposition process. Hence, oxygen gas and argon gas are injected into a reaction chamber as a process gas during the deposition process of the ITO thin film. As one embodiment, a flow rate of the injected oxygen gas is 1 sccm~10 sccm, and a flow rate of the injected argon gas is 150 sccm~250 sccm.

At S12, the noncrystalline ITO thin film 2 is crystallized by an excimer laser anneal process at a preset temperature so as to obtain a crystalline ITO thin film 3. Particularly, an excimer laser equipment is used to emit laser to radiate the noncrystalline ITO thin film 2 from an upper surface of the noncrystalline ITO thin film 2 so as to crystallize the noncrystalline ITO thin film 2. The noncrystalline ITO thin film 2 absorbs laser energy and converts the same into heat energy during the laser crystallization, and the noncrystalline ITO thin film 2 starts rapidly melting to an internal from a surface, of which the melting depth mainly depends on a laser energy density, a pulse frequency and a thin film thickness. A crystal nucleus is formed at the interface between the melt ITO and solid phase interface during the crystallization, of which the nucleation rate depends on a maintenance time of the melting phase. The crystal nucleus grows in two directions parallel to and perpendicular to the substrate (the color filter substrate 12) within a short time after the laser pulse ends and with rapid reduction of the overall temperature of the thin film.

Wherein the preset temperature indicates the temperature of the liquid crystal panel 1 while the excimer laser anneal process is performed, and the preset temperature shall be lower than the highest temperature that the liquid crystal layer 13 in the liquid crystal panel 1 may bear and is generally lower than 140° C. In the more preferred solution, the preset temperature is set to be not exceed 100° C.; and in the most preferred solution, the preset temperature is set to be not exceed 60° C. In the above step S12, by using the excimer laser anneal process, the crystallization process is much short, and a surface of the noncrystalline ITO thin film 2 absorbs a larger amount of energy, so that heat impact on the color filter substrate 12 is small. By adjusting a laser energy density and a pulse frequency, not only the requirement for crystallization of the ITO thin film is satisfied, but also the temperature of the liquid crystal panel 1 is controlled to meet the requirement for the preset temperature and to be lower than the highest temperature that the liquid crystal layer 13 may bear, so that the liquid crystal layer 13 in the liquid crystal panel 1 is effectively protected from being damaged due to high temperature.

Embodiment 2

Figure 2A:
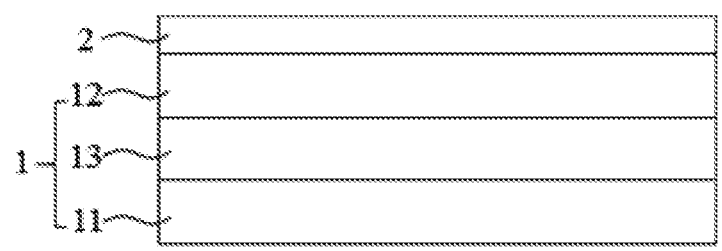
FIGS. 2A~2D are illustrative diagrams of component structures correspondingly obtained by respective steps in a method of forming an On-cell type touch panel provided in embodiment 2 of the present disclosure.

The present embodiment provides a method of forming an On-cell type touch panel, by referring to FIGS. 2A to 2D, the method includes:

At S21, as shown in FIG. 2A, the noncrystalline ITO thin film 2 is formed on the liquid crystal panel 1 after cell alignment. The liquid crystal panel 1 includes the array substrate 11 and the color filter substrate 12 which are disposed to face each other, and the liquid crystal layer 13 is disposed between the array substrate 11 and the color filter substrate 12. In the present embodiment, a noncrystalline ITO thin film 2 is formed on a surface of a side of the color filter substrate 12 being far away from the liquid crystal layer 13, by a deposition process. Particularly, the step S21 may be carried out by referring to the step S11 in embodiment 1.

Figure 2B:
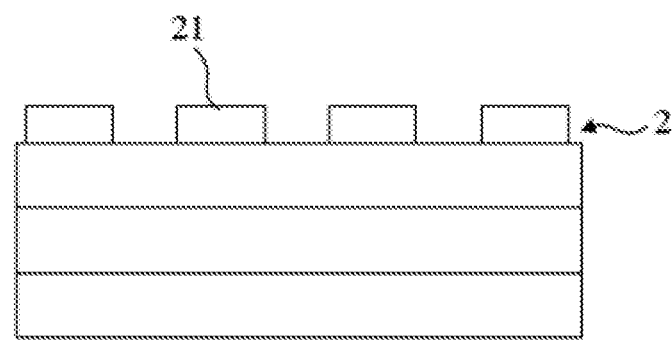

At S22, as shown in FIG. 2B, the noncrystalline ITO thin film 2 is etched to form the patterned touch sensing electrode 21 by a lithographic process. The noncrystalline ITO thin film is more easily etched than the crystalline ITO thin film, hence, the noncrystalline ITO thin film 2 needs to be first etched to form the patterned touch sensing electrode 21, wherein the etching process is mainly a wet etching process.

Figure 2C:
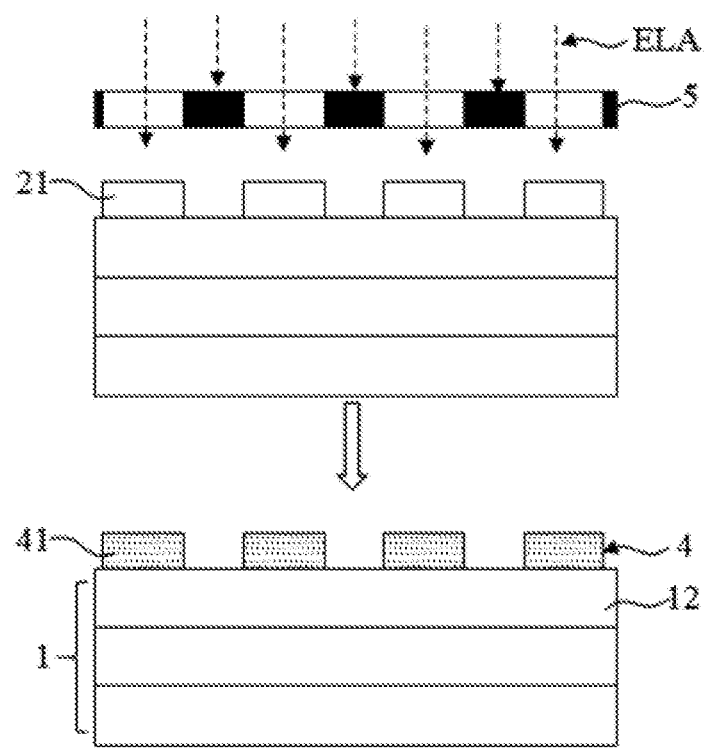

At S23, as shown in FIG. 2C, the noncrystalline ITO thin film corresponding to the patterned touch sensing electrode 21 is crystallized by an excimer laser anneal process at a preset temperature so as to form a crystalline ITO thin film, at this point, a touch sensing electrode 41 of the crystalline ITO thin film is obtained, which has characteristics of low impedance and high transmissivity, thereby improving the quality of the touch panel. A plurality of the touch sensing electrodes 41 jointly form a touch sensing electrode layer 4, and the touch sensing electrode layer 4 is on-cell disposed on the color filter substrate 12 of the liquid crystal panel 1. Wherein the excimer laser anneal process of step S23 may be carried out by referring to the step S12 in embodiment 1, as a result, the performance of liquid crystal in the cell is not affected during the process of crystallizing the patterned touch sensing electrode 21. More particularly, when the excimer laser anneal process is performed in the step, as shown in FIG. 2C, a laser may be selectively irradiated only on the patterned touch sensing electrode 21 by disposing a mask 5.

Figure 2D:
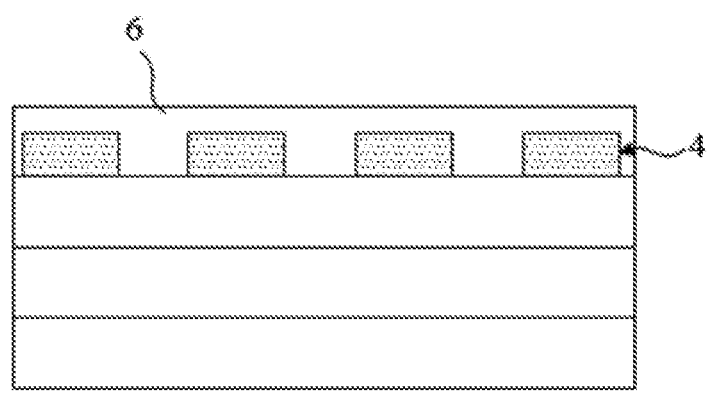

At S24, as shown in FIG. 2D, a protective layer 6 is formed on the touch sensing electrode layer 4. Particularly, the protective layer 6 may be a silicon oxide (SiOx) layer, a silicon nitride (SiNx) layer or a composite structural layer in which a silicon oxide layer and a silicon nitride layer are laminated.

In the method of forming an On-cell type touch panel provided by the above embodiment, after etching the noncrystalline ITO thin film to form a patterned touch sensing electrode, a crystallization process is performed on the patterned touch sensing electrode by using the excimer laser anneal process to obtain a touch sensing electrode of a crystalline ITO thin film which has characteristics of low impedance and high transmissivity, and the quality of the touch panel is improved. Meanwhile, by using an excimer laser anneal process, a temperature of an area in an inner side of the color filter substrate may also be controlled to be comparatively low and lower than the highest temperature that the liquid crystal layer may bear, thereby effectively protecting the liquid crystal layer in the liquid crystal panel from being damaged due to high temperature.

It needs to be explained that the relationship terms, such as first and second, etc., in the present text are only used for distinguishing one entity or operation from another entity or operation without requiring or implying any actual relation or sequence existing between these entities or operations. Moreover, the term "include", "contain" or any other variant means covering instead of exclusively including, so that the process, method, object or device including a series of factors not only includes those factors but also includes other factors that are not explicitly listed or further include inherent factors for this process, method, object or device. Where no more limitations are provided, the factors defined by the sentence "include one . . . " do not exclude additional identical factors existing in the process, method, object or device which includes the factors.

The above statements are only the specific embodiments of the present application, it should be pointed out that, to those ordinary skilled in the art, several improvements and polish can be made without departing from the principle of the present application, also those improvements and polish should be considered as the protection scope of the present application.

What is claimed is:

1. A method of forming an On-cell type touch panel, comprising forming a touch sensing electrode layer on a liquid crystal panel, the liquid crystal panel comprising an array substrate and a color filter substrate that are disposed to face each other, and a liquid crystal layer being disposed between the array substrate and the color filter substrate, wherein the forming of the touch sensing electrode layer on the liquid crystal panel comprises:
   forming a noncrystalline ITO thin film on a surface of a side of the color filter substrate being far away from the liquid crystal layer, by a deposition process;
   etching the noncrystalline ITO thin film by a lithographic process so as to form a patterned touch sensing electrode; and
   crystallizing the noncrystalline ITO thin film corresponding to the patterned touch sensing electrode by an excimer laser anneal process at a preset temperature so as to form a crystalline ITO thin film,
   wherein oxygen gas is injected into a reaction chamber as a process gas during the process of forming the noncrystalline ITO thin film.

2. The method of forming an On-cell type touch panel of claim 1, wherein the deposition process is a low temperature magnetron sputtering process.

3. The method of forming an On-cell type touch panel of claim 2, wherein argon gas is injected into the reaction chamber as the process gas during the process of forming the noncrystalline ITO thin film by the low temperature magnetron sputtering process.

4. The method of forming an On-cell type touch panel of claim 3, wherein a flow rate of the injected oxygen gas is 1 sccm~10 sccm, and a flow rate of the injected argon gas is 150 sccm~250 sccm.

5. The method of forming an On-cell type touch panel of claim 1, wherein a thickness of the crystalline ITO thin film is 50 nm~80 nm.

6. The method of forming an On-cell type touch panel of claim 1, wherein the preset temperature does not exceed 100° C.

7. The method of forming an On-cell type touch panel of claim 1, further comprising forming a protective layer on the touch sensing electrode layer after the patterned touch sensing electrode is crystallized.

8. The method of forming an On-cell type touch panel of claim 7, wherein the protective layer is a silicon oxide layer, a silicon nitride layer or a composite structural layer in which a silicon oxide layer and a silicon nitride layer are laminated.

9. A method of forming a crystalline ITO thin film for forming the crystalline ITO thin film on a liquid crystal panel, the liquid crystal panel comprising an array substrate and a color filter substrate that are disposed to face each other, and a liquid crystal layer being disposed between the array substrate and the color filter substrate, wherein the method comprises:

forming a noncrystalline ITO thin film on a surface of a side of the color filter substrate being far away from the liquid crystal layer, by a deposition process; and crystallizing the noncrystalline ITO thin film by an excimer laser anneal process at a preset temperature so as to obtain the crystalline ITO thin film, wherein oxygen gas is injected into a reaction chamber as a process gas during the process of forming the noncrystalline ITO thin film.

10. The method of forming a crystalline ITO thin film of claim 9, wherein the deposition process is a low temperature magnetron sputtering process.

11. The method of forming a crystalline ITO thin film of claim 9, wherein argon gas is injected into the reaction chamber as the process gas during the process of forming the noncrystalline ITO thin film.

12. The method of forming a crystalline ITO thin film of claim 11, wherein a flow rate of the injected oxygen gas is 1 sccm~10 sccm, and a flow rate of the injected argon gas is 150 sccm~250 sccm.

13. The method of forming a crystalline ITO thin film of claim 9, wherein a thickness of the crystalline ITO thin film is 50 nm~80 nm.

14. The method of forming a crystalline ITO thin film of claim 9, wherein the preset temperature does not exceed 100° C.

15. The method of forming a crystalline ITO thin film of claim 9, wherein the preset temperature does not exceed 60° C.

16. The method of forming an On-cell type touch panel of claim 1, wherein the preset temperature does not exceed 60° C.

* * * * *